United States Patent [19]

Zarkov

[11] 4,034,325

[45] July 5, 1977

[54] COARSE AND FINE ADJUSTMENT WARP COIL

[75] Inventor: Sviatoslav Zarkov, River Forest, Ill.

[73] Assignee: Motorola, Inc., Schaumburg, Ill.

[22] Filed: Feb. 26, 1976

[21] Appl. No.: 661,665

[52] U.S. Cl. .................................. 336/75; 336/132; 336/136

[51] Int. Cl.² ......................................... H01F 21/06

[58] Field of Search ............ 336/130, 131, 132, 83, 336/136, 75, 77; 323/90, 51, 52; 334/74, 76

[56] References Cited

UNITED STATES PATENTS

| 2,477,475 | 7/1949 | Bradon | 336/132 X |
| 2,483,596 | 10/1949 | Rudd et al. | 336/131 |
| 2,752,578 | 6/1956 | Winkel | 336/130 |

FOREIGN PATENTS OR APPLICATIONS

| 522,049 | 2/1956 | Canada | 336/136 |
| 479,880 | 8/1936 | United Kingdom | 336/83 |

Primary Examiner—Thomas J. Kozma
Attorney, Agent, or Firm—Victor Myer; James W. Gillman

[57] ABSTRACT

An inductor coil consisting of two cores enclosed by a single layer of wire is disclosed. The cores may be of the same or different permeability. The coils arranged in this configuration behave like two coils in series in which the relative values of inductance can be varied independently, thus the change in inductance depends only on the number of turns and the relative permeability of the cores. Decreased sensitivity, however, is obtained because of the increased area inside of the coil provided by the two cores side by side.

6 Claims, 3 Drawing Figures

COARSE AND FINE ADJUSTMENT WARP COIL

BACKGROUND OF THE INVENTION

This invention relates to warp (adjustment) coils for adjusting the frequency of crystal controlled oscillators in the VHF and UHF areas, for example, and it is an object of the invention to provide an improved warp coil of this nature. In such oscillators, the circuits utilizing the piezoelectric crystals need adjustability because the crystals themselves, after manufacture, do not have the precisely defined frequency required.

Prior solutions to this problem have included the use of a toroidal inductor plus a warp coil in series with the piezoelectric crystal. While this solution solved the problem within some limits, it lacked the necessary sensitivity and was expensive because of the cost of the toroidal inductor and the warp coil. In this prior solution the toroidal inductor usually had a ferrite core and could thus provide sufficient inductance for producing the necessary coarse adjustment, but an additional series warp coil was necessary to produce the fine adjustment. In these fine adjustment coils there tended to be excessive inductance change per unit turn of the core in the coil to have the necessary decreased sensitivity for accurate adjustment of the final desired frequency unless specially spaced wound coils were used.

SUMMARY OF THE INVENTION

It is a further object of the invention to provide an improved coarse and fine warp coil which will eliminate the objections of the prior art solutions.

In carrying out the invention according to one form an adjustable inductor is provided comprising a coil of a predetermined number of turns and a predetermined interior dimension and two cores of predetermined permeability adapted to be disposed side by side within the predetermined dimension, and at least one of the cores being movable relative to the other.

According to a further embodiment of the invention an adjustable inductor adapted for coarse and fine adjustment is provided comprising a first tube of insulating material, a second tube of insulating material disposed along side the first insulating material, a first metallic core of a predetermined permeability disposed in the first tube, a second metallic core of a predetermined permeability disposed in the second tube, and a winding having a predetermined number of turns surrounding both the first and second insulating tubes, at least one of the first and second cores being movable relative to the other.

DESCRIPTION OF THE PREFERRED EMBODIMENT

Figure 1:
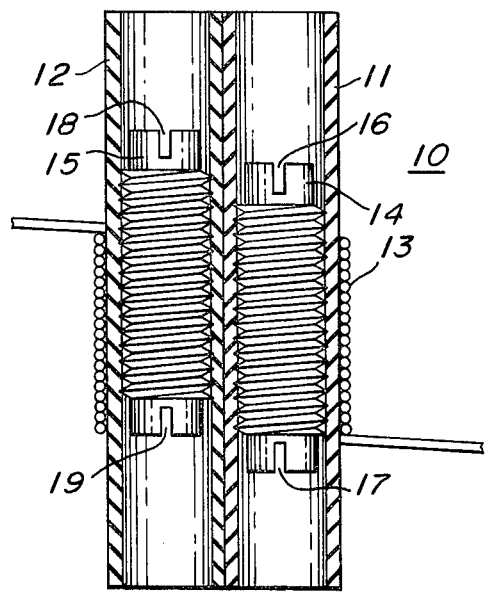
FIG. 1 is a cross-sectional view of an inductor coil according to the invention.

Referring to the drawings there is shown an inductor 10 comprising two dielectric or insulating tubes 11 and 12 disposed side by side, a winding 13 wrapped around both cores 11 and 12 and a pair of metallic threaded cores 15 and 16 disposed inside of dielectric tubes 11 and 12 respectively.

The cores 14 and 15 includes slots 16, 17, 18, 19, in order that the cores may be adjusted in position from either end by the use of an ordinary small screwdriver. The interior of the tubes 11 and 12 need not be threaded because the threads of the cores bite into the interior surface of the tubes.

Figure 2:
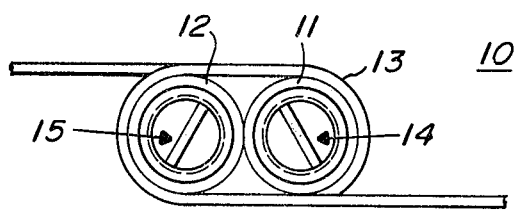
FIG. 2 is a top view of the inductor shown in FIG. 1.

Referring to FIG. 2, the winding 13 surrounds both tubes 11 and 12 and, thus, also, the cores 14 and 15. It is therefore completely clear that the area within the winding 13 is over twice the area that it would be if the winding surrounded only a single one of the tubes 11 or 12. If the two coils were placed in series and the same number of turns applied around each coil, the area of each coil would be reduced by at least half, as compared with both coils, and consequently, the inductance thereof would be reduced. Thus, by placing the coils side by side and using a single coil the area within the coil is increased by a factor greater than two and the inductance of the combination is thereby increased by at least a factor of two.

Figure 3:
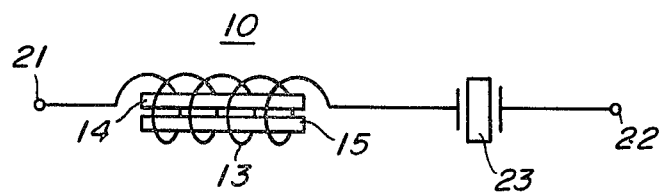
FIG. 3 is a simplified circuit diagram illustrating use of the inventive inductor.

Referring to FIG. 3, there is shown a circuit having terminals 21 and 22 between which in series are connected the coil 10 and a piezoelectric crystal 23. It is the frequency of the crystal 23 that needs to be warped to the right value by the inclusion of the coil 10. This is efficiently and conveniently done, according to the invention, by the coil having two cores surrounded by a single layer of turns as described. The toroidal inductor of the prior art is thus eliminated, while at the same time the sensitivity of the adjustability is decreased.

Sensitivity of the coil is defined by the change in inductance per unit turn of the winding when either of the cores 14 or 15 is moved. Thus, while the inductance is increased by a factor of over two by virtue of having the increased area of the coil when the two cores are side by side, the sensitivity is only one quarter of the value of a single coil because of the decreased change in inductance per unit turn. Accordingly very accurate adjustments of the crystal frequency may be made with the single coil unit is illustrated.

Referring to FIG. 1, it will be noted that the cores may occupy any position relative to the winding 13 from all the way into the coil to all the way out. The inductive effect of the core of course is the greater when it is completely within the winding rather than only partially in.

The cores 14 and 15 may be of different materials, such for example, as 15 may be of ferrite and 14 may be of aluminum. The ferrite material is highly magnetic and relatively small movements of the core 15 therefore may be used to obtain wide changes in inductance and thus relatively wide changes in frequency of the crystal 23 for coarse adjustment. In this instance the core 14 being of aluminum, a diamagnetic material, much smaller changes in inductance are made by one turn or less or more for that matter of the core 14 into the coil 13. In this way, very fine or small changes in inductance and frequency are obtainable. In particular cases, it is of course feasible, for the cores 14 and 16 to be of the same material, for example, aluminum.

A very substantial advantage of the device as illustrated and described is that the frequency of the crystal 23 can be warped onto the desired value by simply adjusting the positions of the cores 14 and 15 inside the inductor winding 13. No selection of a toroidal core, for example, to fit the initial frequency of the crystal is necessary. All adjustments can be made by changing the cores 14 and 15 in the single coil. Moreover, this can be done with greatly decreased sensitivity and therefore much more expeditiously and accurately.

The coils connected as described behave as two coils connected in series in which the relative values of inductance can be varied independently. The change in inductance depends only on the number of turns and the relative core permeabilities.

While the coil cross-section, shown in FIG. 2 is oblong, any cross-section, including round, may be used. The term interior dimension is intended to include all of these cases.

In one particular case, for example, the outside diameter of the tubes 11 and 12 was 110 mils, the inside diameter of the tubes 0.083 mils, and the thickness of the walls of the tubes was 0.08 mils. The cores 14 and 15 were aluminum ¼ of an inch in length and the winding 13 and 16 turns of number 30 wire. Other dimensions, of course, can be used to particular circumstances. The particular crystal circuit was intended to operate in the 39 to 62 MHz range. The material of the tubes was that commercially available under the trade name Nylon Zytel made by Dupont.

I claim:

1. A two-terminal, single-winding adjustable inductor for connection into a circuit for adjusting the frequency thereof comprising only one winding of a predetermined number of turns and a predetermined interior dimension, two insulating tubes disposed side by side inside of said winding, and two cores of predetermined permeability, one each of said cores being disposed in one each of said insulating tubes, both of said cores being disposed within the interior of said winding for decreasing the coil inductance per unit turn, each of said cores being moveable relative to the other one for course adjustments and one for fine adjustments.

2. An adjustment inductor according to claim 1 wherein said two cores comprise materials of different permeabilities for coarse and fine adjustment.

3. An adjustable inductor according to claim 2 wherein one of said cores comprises a diamagnetic material and the other of said cores comprises a magnetic material.

4. An adjustable inductor according to claim 3 wherein said diamagnetic material comprises aluminum and the magnetic material comprises ferrite.

5. An adjustable inductor according to claim 1 wherein one of said cores comprises a magnetic material for course adjustments and the other of said cores comprises a diamagnetic material for fine adjustment.

6. An adjustable inductance according to claim 1 wherein said magnetic material for course adjustment comprises ferrite and said diamagnetic material for fine adjustment comprises aluminum.

* * * * *